(12) United States Patent
Kato

(10) Patent No.: US 8,815,705 B2
(45) Date of Patent: Aug. 26, 2014

(54) LASER MACHINING METHOD AND METHOD FOR MANUFACTURING COMPOUND SEMICONDUCTOR LIGHT-EMITTING ELEMENT

(75) Inventor: Kazuhiro Kato, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 209 days.

(21) Appl. No.: 13/203,112

(22) PCT Filed: Feb. 25, 2010

(86) PCT No.: PCT/JP2010/052954
§ 371 (c)(1),
(2), (4) Date: Aug. 24, 2011

(87) PCT Pub. No.: WO2010/101069
PCT Pub. Date: Sep. 10, 2010

(65) Prior Publication Data
US 2011/0312115 A1    Dec. 22, 2011

(30) Foreign Application Priority Data
Mar. 3, 2009    (JP) .................................. 2009-049311

(51) Int. Cl.
| | |
|---|---|
| *B23K 26/06* | (2014.01) |
| *B23K 26/08* | (2014.01) |
| *B23K 26/40* | (2014.01) |
| *H01L 33/00* | (2010.01) |
| *H01L 21/67* | (2006.01) |

(52) U.S. Cl.
USPC ......................................................... 438/463

(58) Field of Classification Search
CPC ....................... B23K 26/4075; B23K 26/0057
USPC .............. 438/33, 463; 257/E21.347, E33.033
See application file for complete search history.

(56) References Cited

U.S. PATENT DOCUMENTS

| 6,676,878 B2 * | 1/2004 | O'Brien et al. ............... 264/400 |
| 2008/0057680 A1 * | 3/2008 | Watanabe ..................... 438/463 |

(Continued)

FOREIGN PATENT DOCUMENTS

| JP | 2008-060164 A | 3/2008 |
| JP | 2008-087026 A | 4/2008 |

(Continued)

*Primary Examiner* — Olik Chaudhuri
*Assistant Examiner* — Christine Enad
(74) *Attorney, Agent, or Firm* — Sughrue Mion, PLLC

(57) ABSTRACT

Provided is a laser machining method in which, when modified regions are formed plural number of times by changing the depth in the thickness direction of a substrate, displacement of the formed modified regions from a planned cutting line is inhibited. Specifically provided is a laser machining method for cutting a substrate (10) into chips. Modified regions are formed at a deep distance (d1) inside the substrate from the entrance surface of a laser beam by first scanning (a) in which the substrate is scanned with the laser beam along a planned cutting line (21a) in the X direction of the substrate and second scanning (b) in which the substrate is scanned with the laser beam along a planned cutting line (21b) in the Y direction. Modified regions are again formed at a shallow distance (d2) (d1>d2) inside the substrate by third scanning (c) in which the substrate is scanned with the laser beam along the planned cutting line (21a) in the X direction and fourth scanning (d) in which the substrate is scanned with the laser beam along the planned cutting line (21b) in the Y direction. The third scanning is performed by scanning from a U end portion at the periphery to the center and scanning from a D end portion at the periphery to the center.

16 Claims, 9 Drawing Sheets

(56) References Cited

U.S. PATENT DOCUMENTS

2009/0136717 A1* 5/2009 Kihara et al. ............... 428/174
2009/0148975 A1* 6/2009 Kohda ............................ 438/33
2009/0166808 A1* 7/2009 Sakamoto et al. ........... 257/618

FOREIGN PATENT DOCUMENTS

| JP | 2008-244121 A | 10/2008 |
| WO | 2005/098916 A1 | 10/2005 |
| WO | WO 2007034970 A1 * | 3/2007 |

* cited by examiner

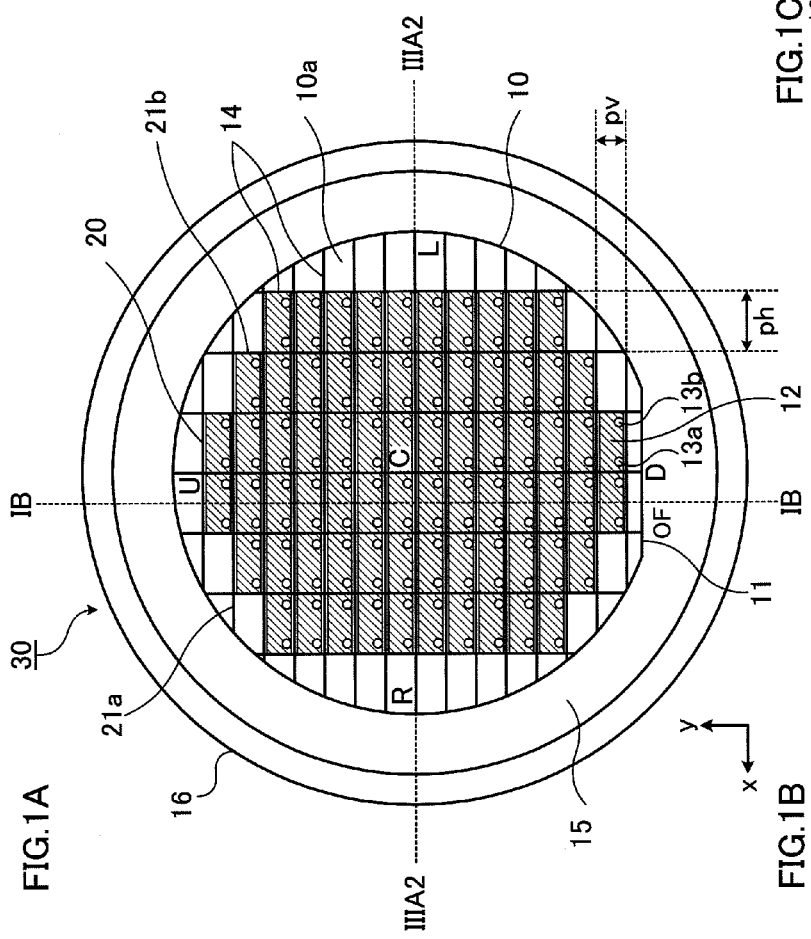
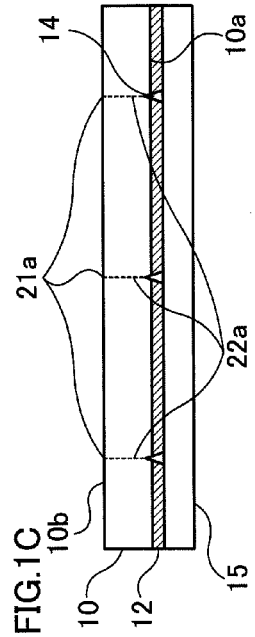
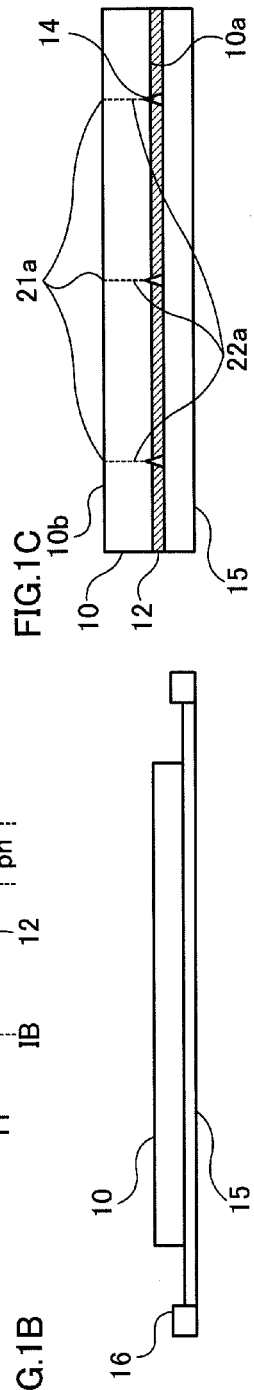
FIG.1A
FIG.1C
FIG.1B

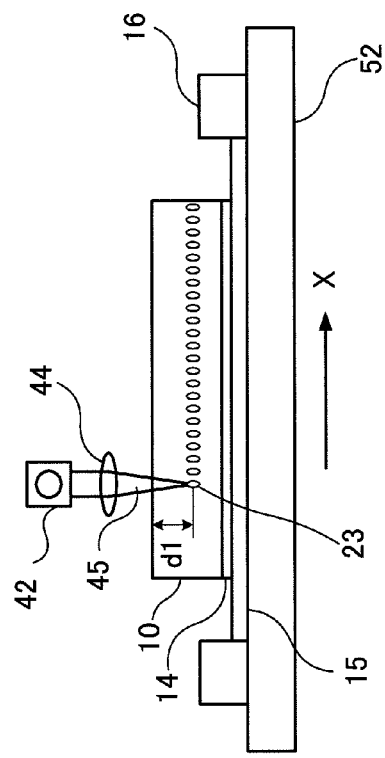
FIG.3A1 CROSS SECTION TAKEN ALONG LINE IB – IB
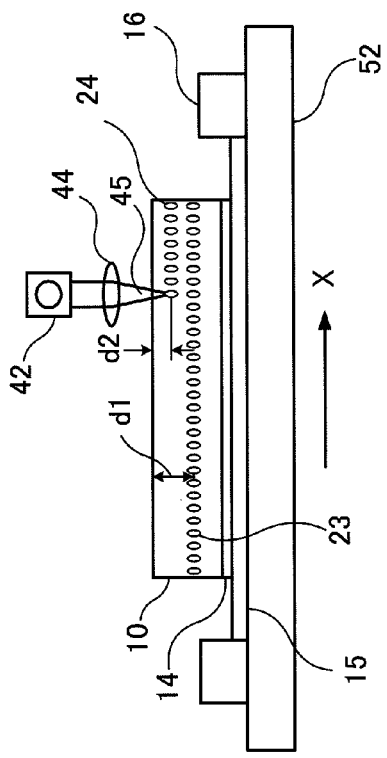
FIG.3A2 CROSS SECTION TAKEN ALONG LINE IIIA2 – IIIA2
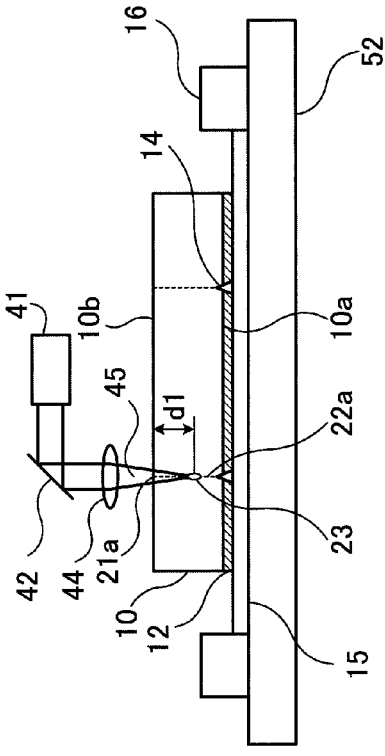
FIG.3B1
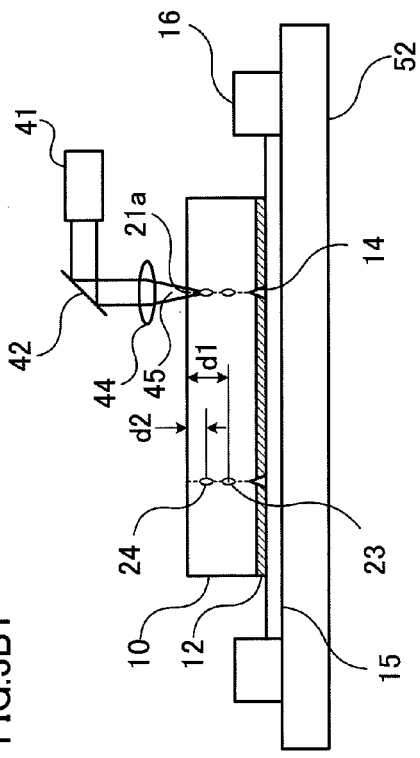
FIG.3B2

FIG.6

| SCANNING DIRECTION | FIRST SCANNING | SECOND SCANNING | THIRD SCANNING | | FOURTH SCANNING |
| --- | --- | --- | --- | --- | --- |
| | | | FIRST STEP | SECOND STEP | |
| SCANNING DIRECTION | X | Y | X (FROM OPPOSITE SIDE OF ORIENTATION FLAT) | X (FROM SIDE OF ORIENTATION FLAT) | Y |
| DISTANCE FROM REAR SURFACE (μm) | -35 | | -25 | | |
| OUTPUT OF LASER BEAM (mW) | 65 | 50 | 75 | | 55 |
| SCANNING PITCH (μm) | 240 | 600 | 240 | | 600 |
| NUMBER OF MACHINED LINES | 400 | 170 | 200 | 200 | 170 |

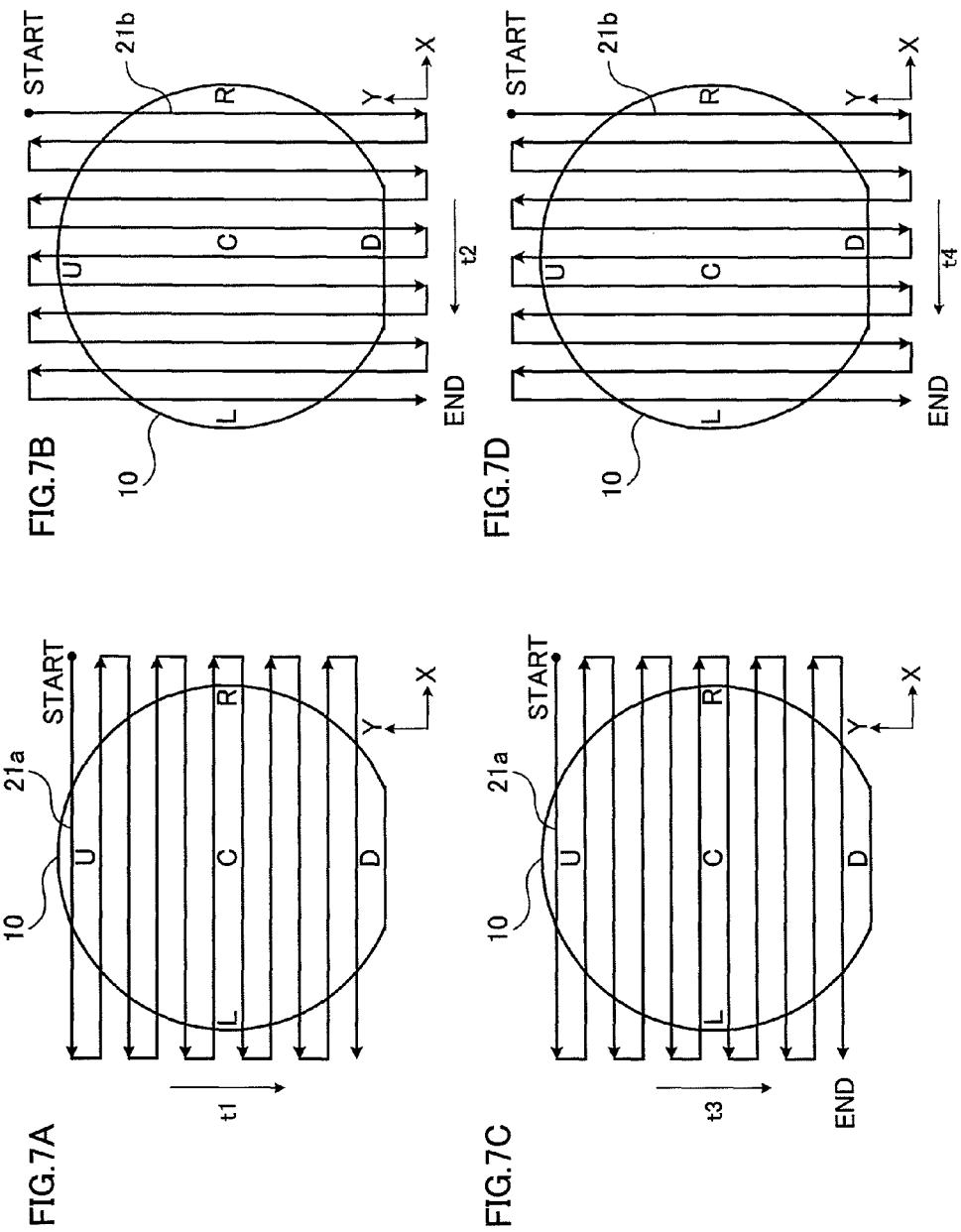

US 8,815,705 B2

LASER MACHINING METHOD AND METHOD FOR MANUFACTURING COMPOUND SEMICONDUCTOR LIGHT-EMITTING ELEMENT

CROSS REFERENCE TO RELATED APPLICATIONS

This application is a National Stage of International Application No. PCT/JP2010/052954 filed Feb. 25, 2010, claiming priority based on Japanese Patent Application No. 2009-049311 filed Mar. 3, 2009, the contents of all of which are incorporated herein by reference in their entirety.

TECHNICAL FIELD

The present invention relates to a laser machining method for slicing (chipping) a substrate such as a semiconductor wafer forming a plurality of electronic elements thereon.

BACKGROUND ART

A substrate such as a semiconductor wafer forming electronic elements like light emitting diodes (LED) and integrated circuits (LSI) thereon is cut into chips. A method for cutting into chips includes a laser machining method called as a stealth dicing method in which a laser beam is condensed by a field lens optical system and irradiation of the laser beam is conducted to the inside of the substrate so that a modified region having a low strength compared with the one before the irradiation is formed along a planned cutting line supposed to be set on the substrate. In this method, the substrate is cut from the modified region as an origin.

Patent document 1 discloses a method in which, when a whole region of the object for machining is separated into three portions, modified regions are formed along a planned cutting line spreading on the region in order of the near-side region, the far-side region and the central region, and displacement of the formed modified regions from the planned cutting line is inhibited.

Patent Document 1: Japanese Patent Application Laid-Open Publication No. 2008-87026

DISCLOSURE OF THE INVENTION

Problems to be Solved by the Invention

There has been a problem of a substrate such as single-crystal sapphire having high hardness (Mohs hardness 9), in which the substrate may not be cut precisely even if modified regions are formed at one position inside the substrate by laser machining. Against this problem, the modified regions are tried to be formed plural times by changing the depth thereof in a thickness direction of the substrate. However, if it is repeated many times, defect of the chip shape occurs since the modified regions are displaced from the supposed planned cutting line and the cross section of the chip is made oblique to the surface of the substrate.

An object of the present invention is to provide a laser machining method that inhibits displacement of the formed modified regions from the planned cutting line when the modified regions are formed plural times by changing the depth thereof in the thickness direction of the substrate.

Means for Solving the Problems

A laser machining method to which the present invention is applied is a laser machining method in which irradiation of a focused laser beam is applied to plural distances from one surface of a substrate formed into a plate on the basis of a planned cutting line supposed to be set on the substrate so that modified regions at the plural distances are formed inside the substrate plural times. The laser machining method includes conducting a first machining method for forming the modified regions from one end portion of a periphery of the substrate toward a central portion of the substrate, and a second machining method for forming the modified regions from the other end portion of the periphery of the substrate toward the central portion of the substrate at least once in the plural times.

Here, when the planned cutting line is supposed to be set in a direction different from a direction along a cleaved facet of the substrate, the modified regions are formed by the first machining method and the second machining method.

Further, when the modified regions for the planned cutting lines supposed to be set on the substrate are formed the plural times, the first machining method and the second machining method are used last time of the plural times.

Furthermore, when the modified regions at the plural distances from the one surface of the substrate are formed inside the substrate the plural times, if an order of forming the modified regions is from a large distance from an entrance surface of the laser beam on the substrate to a small distance therefrom, scattering of the laser beam is reduced.

Meanwhile, when the modified regions at the plural distances from the one surface of the substrate are formed inside the substrate the plural times, if output of the laser beam becomes larger as a distance from an entrance surface of the laser beam on the substrate is smaller, damage of the electronic devices, which are formed on the rear surface opposite to the entrance surface of the laser beam, is reduced.

Further, the substrate is a C-axis orientation sapphire, and the planned cutting line is supposed to be set in a direction different from a direction along a crystal plane (1100).

Furthermore, the aforementioned laser machining method is performed for a substrate such as a semiconductor wafer on which plural electronic elements are formed, and then the substrate is sliced (chipped). For example, a compound semiconductor light-emitting element is manufactured by a method including: preparing an n-type semiconductor layer, a light-emitting layer and a p-type semiconductor layer on a substrate in this order by epitaxial growth; forming plural compound semiconductor light-emitting elements on the substrate prepared by the epitaxial growth; and conducting the aforementioned laser machining method after forming the plural compound semiconductor light-emitting elements. A light-emitting element made of group-III nitride semiconductor is often used as the compound semiconductor light-emitting element.

Advantages of the Invention

According to the present invention, it is possible to reduce occurrence of defect of a chip shape by inhibiting displacement of the modified region formed in the substrate from the planned cutting line.

BEST MODES FOR CARRYING OUT THE INVENTION

Hereinafter, exemplary embodiments of the present invention will be described in detail with reference to the accompanying drawings. Note that the same elements are denoted with the same reference numerals, and overlapping description thereof will be omitted. Note that, the accompanying drawings show a substrate, chips and the like illustratively, and the scale thereof is not accurate.

In addition, in this description, a number which shows plane indices for representing a crystal orientation and to which the minus sign is applied denotes the number with an upper bar (overbar).

First Exemplary Embodiment

FIGS. 1A to 1C are views for illustrating an example of a substrate 10 used in the first exemplary embodiment.

FIG. 1A is a view of the substrate 10 seen from one side. As the substrate 10, for example, a plate substrate made of single-crystal sapphire whose diameter is 4 inches (approximately 100 mm) and thickness is 50 to 250 μm, and which has a C-axis orientation may be used.

At one end of the substrate 10, an orientation flat (OF) 11 which shows a crystal orientation of the substrate 10 and is a reference in a process for forming electronic elements on the substrate 10 is provided. For example, the OF 11 is formed in a [11-20] direction of the single-crystal sapphire.

An n-type semiconductor layer, a light-emitting layer and a p-type semiconductor layer made of group-III nitride semiconductor are epitaxially grown in this order on one surface of the substrate 10, and thus plural LEDs 12 are provided. The substrate 10 is provided with electrodes 13a and 13b for supplying electric current to each LED 12. Each shape of the electrodes 13a and 13b is a circle having a diameter of 100 μm, for example. The LEDs 12 and the electrodes 13a and 13b are configured on the substrate 10 at a certain interval so that they are divided into chips 20 each having a set of the LED 12 and the electrodes 13a and 13b.

In this description, the surface of the substrate 10 on which the LEDs 12 are formed is called as a front surface 10a, and the other side thereof is called as a rear surface 10b.

On the front surface 10a shown in FIG. 1A, an end where the OF 11 is provided is set as a D end portion, an end opposite to the OF 11 is set as a U end portion, a right-side end is set as an L end portion, and a left-side end is set as an R end portion on the assumption that the OF 11 is located on the downside. In addition, the central portion is set as a C portion. Further, on the front surface 10a shown in FIG. 1A, the downside of the substrate 10 located around the D end portion is called as a D end-portion side, an upside of the substrate 10 located around the U end portion is called as a U end-portion side, a right side of the substrate 10 located around the L end portion is called as an L end-portion side, and the left side of the substrate 10 located around the R end portion is called as an R end-portion side.

Further, a direction along the OF 11 is set as an x direction, and a direction perpendicular to the OF 11 is set as a y direction.

Note that, as described later, since irradiation of a laser beam is conducted from the rear surface 10b, an R portion side is set as a right side and an L portion side is set as a left side when the rear surface 10b is seen. Further, a plus direction of the x direction is set as a direction from the L portion side to the R portion side.

The chip 20 is a rectangular, and the size of the chip 20 is ph in the x direction and pv in the y direction. For example, ph is 600 μm, and pv is 240 μm. On the substrate 10, planned cutting lines 21a and 21b are supposed to be set in the x direction and the y direction respectively, for dividing the substrate 10 into the chips 20. The planned cutting lines 21a are supposed to be set at a pitch of pv in the y direction, and the planned cutting lines 21b are supposed to be set at a pitch of ph in the x direction. For example, if the size of the substrate 10 is 4 inches and the size of the chip 20 is 600 μm (ph) and 240 μm (pv), there are 400 planned cutting lines 21a and 170 planned cutting line 21b.

Note that, the planned cutting lines 21a and 21b are supposed lines and may not be specifically shown as a line. A pattern or grooves may be formed on the front surface 10a or the rear surface 10b so as to correspond to the supposed planned cutting lines 21a and 21b.

In the first exemplary embodiment, corresponding to the supposed planned cutting lines 21a and 21b, grooves (cracked grooves) 14 are formed on the substrate 10 so as to be set as an origin for cutting of the chips 20. The cracked grooves 14 are formed by partly scraping a sapphire of the substrate 10 and the grown epitaxial layer of the n-type semiconductor layer, the light-emitting layer and the p-type semiconductor layer on the front surface 10a by irradiation of a YAG (Yttrium Aluminum Garnet) laser beam.

The substrate 10 is attached to an adhesive sheet 15 held by a metallic ring 16.

The metallic ring 16 is set to be larger than the diameter of the substrate 10. The substrate 10 is attached to the inside portion of the metallic ring 16 while the substrate 10 is not in contact with the metallic ring 16. Note that, the adhesive sheet 15 prevents the cut chips 20 from scattering, while holding the substrate 10 in laser machining.

After the laser machining for forming the modified regions inside the substrate 10, a breaking process in which the substrate 10 is cut into the chips 20 by, for example, pressing a blade against the supposed planned cutting lines 21a and 21b is executed. In the breaking process, the substrate 10 is cut into the chips 20 by cracking from the formed modified regions as an origin.

Thereafter, the adhesive sheet 15 is extended, and thus each interval between the chips 20 is widened, which facilitates the mounting work to a package.

FIG. 1B shows a cross-sectional view of the substrate 10, the adhesive sheet 15 and the metallic ring 16 taken along a line IB-IB shown in FIG. 1A. FIG. 1C is an enlarged view of the cross section of a part of the substrate 10 and the adhesive sheet 15 shown in FIG. 1A taken along the line IB-IB.

As shown in FIG. 1C, the substrate 10 is provided with the front surface 10a on which the LEDs 12 are formed and which is attached to the adhesive sheet 15. Hence, FIG. 1A shows a state that the front surface 10a is seen through the adhesive sheet 15.

Further, as shown in FIG. 1C, vertically extended planes from the respective planned cutting lines 21a (supposed to be provided on the rear surface 10b as a matter of convenience) supposed to be set on the substrate 10 to the respective cracked grooves 14 formed on the front surface 10a, are planned cutting planes 22a corresponding to the planned cutting lines 21a. In other words, in the first exemplary embodiment, it is desirable to form the cross section of the chips 20 vertically.

Similarly, vertically extended planes from the rear surface 10b to the front surface 10a are planned cutting planes corresponding to the planned cutting lines 21b supposed to be set on the substrate 10.

Hereinafter, the metallic ring 16, the adhesive sheet 15 held by the metallic ring 16, and the substrate 10 attached to the adhesive sheet 15 are called as a substrate unit 30.

FIG. 2 is a view for illustrating a laser machining equipment 50 used in the first exemplary embodiment.

The laser machining equipment 50 is provided with a base 51 for installation on a table or the like, and an adsorption stage 52 which is equipped on the base 51 and is movable in a right-to-left direction (called as X direction), a front-back direction (called as Y direction) and up-and-down direction (called Z direction), and rotatable (a rotational direction is called as θ axis direction) on the base 51. The base 51 is provided with a motor making the adsorption stage 52 moved in the X direction, the Y direction or the Z direction, a motor making the adsorption stage 52 rotated in the θ axis direction, and an electronic circuit controlling these motors.

The adsorption stage 52 fixes the substrate unit 30 by vacuum adsorption. Here, the substrate unit 30 is equipped so that the x direction and the y direction of the substrate 10 correspond to the X direction and the Y direction of the base 51 respectively. In other words, the substrate 10 is equipped on the adsorption stage 52 so that the OF 11 is located on the front side.

Further, the laser machining equipment 50 is provided with a support 55 provided on the base 51. The support 55 supports a laser beam generator 41. In FIG. 2, a part of the laser beam generator 41 is shown with a broken line in order to show an inner structure. The laser beam generator 41 generates a pulsed excimer laser beam. The laser beam generator 41 is provided with a dichroic mirror 42 for refracting the laser beam by 90 degrees. Additionally, the laser beam generator 41 is provided with an optical system 44 that condenses the laser beam reflected on the dichroic mirror 42 and makes the focal point located inside the substrate 10.

The support 55 supports an arm 56. The arm 56 is provided with an image capture portion 62 for observing the substrate 10 through the dichroic mirror 42.

Further, the laser machining equipment 50 is provided with a loaded cassette elevator 57 and an unloaded cassette elevator 58. The loaded cassette elevator 57 contains a loaded cassette 57a containing the substrate unit 30 before the laser machining. The substrate unit 30 contained in the loaded cassette 57a is moved to the adsorption stage 52 by a robotic arm (not shown in the figure) and then is set. The unloaded cassette elevator 58 contains an unloaded cassette 58a containing the substrate unit 30 after the laser machining. The substrate unit 30 after the laser machining is moved from the adsorption stage 52 to the unloaded cassette 58a by the robotic arm, and then is contained.

Furthermore, the laser machining equipment 50 is provided with a controller 61 that controls the adsorption stage 52, the laser beam generator 41, the loaded cassette elevator 57, the unloaded cassette elevator 58 and the like. In addition, the laser machining equipment 50 is provided with a display portion 63 for displaying an image of the substrate 10 captured by the image capture portion 62 or control information from the controller 61.

FIGS. 3A1 to 3B2 are views for illustrating a method for forming the modified regions inside the substrate 10 by the laser machining.

Here, the detailed description of a method for forming the LEDs 12 and the electrodes 13a and 13b are omitted since they are formed by a well-known method. Description will be given for the laser machining after the substrate unit 30 in which the substrate 10 is attached to the adhesive sheet 15 held by the metallic ring 16 is equipped on the adsorption stage 52.

In the first exemplary embodiment, the laser beam generator 41 irradiates a position at a deep distance from the rear surface 10b (distance d1) and a position at a shallow distance therefrom (distance d2) compared to the former one with a condensed laser beam 45 when the rear surface 10b is set as "zero" (reference surface). In other words, the laser beam generator 41 forms the modified regions at plural distances from the rear surface 10b. The laser beam generator 41 firstly forms the modified regions at the deep distance from the rear surface 10b, and then forms the modified regions at the shallow distance from the rear surface 10b.

FIGS. 3A1 and 3A2 show a process for forming the modified regions at the position at the deep distance (distance d1) from the rear surface 10b that is an entrance surface of the laser beam 45. FIG. 3A1 is a cross sectional view of the substrate unit 30 equipped on the adsorption stage 52 taken along the line IB-IB in FIG. 1A, and FIG. 3A2 is also a cross sectional view taken along a line IIIA2-IIIA2 in FIG. 1A. FIG. 3A1 shows the metallic ring 16, the adhesive sheet 15, the substrate 10, the LEDs 12 and the cracked grooves 14 formed on the front surface 10a, and the planned cutting lines 21a and the planned cutting planes 22a supposed to be set on the substrate 10, which are equipped on the adsorption stage 52. Note that, only 2 planned cutting planes 22a are shown in FIG. 3A1.

On the other hand, the cross section of the substrate unit 30 taken along the line IIIA2-IIIA2 in FIG. 1A, which is shown in FIG. 3A2, is the cross section at the planned cutting plane 22a. Therefore, in FIG. 3A2, the cracked groove 14 is shown instead of the LEDs 12 in FIG. 3A1.

As shown in FIG. 3A1, the laser beam 45 enters from the rear surface 10b and is condensed at the distance d1 from the rear surface 10b in the planned cutting plane 22a by the optical system 44.

Then, as shown in FIG. 3A2, plural modified regions 23 are repeatedly formed with the laser beam 45 in response to pulse oscillation while the adsorption stage 52 is moved in the X direction. For example, the pulse oscillation frequency of the laser beam 45 is set at 15,000 to 30,000 Hz, and the moving speed of the adsorption stage 52 is set at 100 to 500 mm/sec.

Next, FIGS. 3B1 and 3B2 show a process for forming the modified regions at the shallow position (distance d2) from the rear surface 10b. FIG. 3B1 is a cross sectional view of the substrate unit 30 equipped on the adsorption stage 52 taken along the line IB-IB in FIG. 1A, and FIG. 3B2 is also a cross sectional view taken along a line IIIA2-IIIA2 in FIG. 1A. The cross sections shown in FIGS. 3B1 and 3B2 are the same as those in FIG. 3A1 and 3A2. As shown in FIGS. 3B1 and 3B2, the modified regions 23 have already been formed at the distance d1 from the rear surface 10b and inside the substrate 10.

As shown in FIG. 3B1, the laser beam 45 is condensed at the distance d2 (d2<d1) from the rear surface 10b. Further, as shown in FIG. 3B2, plural modified regions 24 are repeatedly formed with the laser beam 45 in response to pulse oscillation while the adsorption stage 52 is moved in the X direction.

As described above, in the first exemplary embodiment, the modified regions 23 and 24 are formed by making the focal point of the laser beam 45 located at respective 2 positions from the rear surface 10b in the planned cutting plane 22a supposed to be set in the substrate 10. In other words, the modified regions 23 and the modified regions 24 are formed in two rows inside the substrate 10.

The modified regions 23 and 24 are regions which are cracked or melted by the condensed strong laser beam 45, and thus they have low strength in comparison with the other regions which are not irradiated with the laser beam 45. Therefore, the modified regions 23 and 24 become an origin for starting to break easily by pressing a blade or the like in the breaking process.

In other words, in the first exemplary embodiment, the substrate 10 is cut into the chips 20 by forming the modified regions in the two rows inside the substrate 10.

Note that, in the first exemplary embodiment, after the modified regions 23 are formed at the position at the deep distance (d1) from the rear surface 10b, the modified regions 24 are formed at the position at the shallow distance (d2). In other words, the modified regions are formed in order of decreasing distance from the entrance surface of the laser beam 45. The reason is as follows. If the modified regions 23 are formed at the deep position (d1) after the modified regions 24 are formed at the shallow position (d2) in an opposite manner, the laser beam 45 goes through the modified regions 24 formed at the shallow position (d2) and then is condensed at the deep position (d1). In consequence, since there is an influence on the laser beam 45 such as scattering by the modified regions 24, it causes difficulty of forming the modified regions 23.

FIG. 4 is a flowchart of the laser machining method in the first exemplary embodiment.

Note that, FIG. 4 shows a flow after the loaded cassette 57a which contains the substrate unit 30 subjected to the laser machining is set in the loaded cassette elevator 57 of the laser machining equipment 50 and further an empty unloaded cassette 58 is set in the unloaded cassette elevator 58.

FIGS. 5A to 5D are views showing directions in which the substrate 10 is scanned with the laser beam 45 in the laser machining method in the first exemplary embodiment. FIG. 5A shows a first scanning in which the substrate 10 is scanned with the laser beam 45 in the X direction, FIG. 5B shows a second scanning in which the substrate 10 is similarly scanned in the Y direction, FIG. 5C shows a third scanning in which the substrate 10 is rescanned with the laser beam 45 in the X direction, and FIG. 5D shows a fourth scanning in which the substrate 10 is similarly rescanned in the Y direction.

Hereinafter, the laser machining method will be described on the basis of the flowchart of FIG. 4 with reference to FIGS. 5A to 5D.

First, the laser machining equipment 50 moves the first substrate unit 30 from the loaded cassette 57 to the adsorption stage 52 with the robotic arm (step 101). Then, the adsorption stage 52 adsorbs the substrate unit 30 by vacuum adsorption. At this time, the controller 61 of the laser machining equipment 50 moves the adsorption stage 52 in the X direction and the Y direction and rotates it in the θ axis direction so that the x direction of the substrate 10 is aligned to the X direction.

Next, the controller 61 measures the thickness of the substrate 10 and the adhesive sheet 15, and sets the rear surface 10b as a reference surface ("zero") (step 102).

Note that, the thickness of the substrate 10 and the adhesive sheet 15 may be given by difference between distances to the focal points measured by the optical system 44 in the presence and absence of the substrate unit 30.

Precise alignment of the substrate 10 is conducted in the X direction, the Y direction and the θ axis direction (step 103). Here, the planned cutting lines 21a and 21b are set to correspond to the irradiation positions of the laser beam 45, and thereby the position of the adsorption stage 52 is set so that scanning with the laser beam 45 is conducted along the planned cutting lines 21a and 21b supposed to be set on the substrate 10. This setting may be visually conducted by an operator of the laser machining equipment 50, or automatically conducted by the controller 61 on the basis of an image of the substrate 10 captured by the image capture portion 62.

Then, the controller 61 automatically moves the adsorption stage 52 in the X direction and the Y direction on the basis of the size of the substrate 10 and the preset pitch of the scanning, and irradiates the substrate 10 with the laser beam 45.

First, description will be given for a process for forming the modified regions 23 by irradiating the deep positions (d1) from the rear surface 10b inside the substrate 10 with the laser beam 45.

The controller 61 sets the position of the focal point of the laser beam 45 at the distance "d1" on the assumption that the rear surface 10b is "zero" (step 104). For example, d1 is set at −35 μm.

Note that, the position of the focal point is settable by adjustment of the focal point of the optical system 44. Instead, it may be set by moving the adsorption stage 52 in the Z direction.

Next, the first scanning that forms the modified regions in the X direction is conducted (step 105). Note that, as described later, although the modified regions are formed in the X direction and the −X direction in the first scanning, they are collectively referred as formation of the modified regions in the X direction.

The position of the focal point of the laser beam 45 is d1=−35 μm set in the step 104.

In the first scanning, as shown in FIG. 5A, the controller 61 moves the adsorption stage 52 to a START position provided on the U end-portion side and the R end-portion side of the substrate 10 and outside the substrate 10, and the substrate 10 is ready to be irradiated with the laser beam 45.

Then, while conducting irradiation of the laser beam 45, the controller 61 moves the adsorption stage 52 in the X direction, so that the laser beam 45 is across the substrate 10 from the R end-portion side to the L end-portion side. In this way, the modified regions 23 are formed along the planned cutting lines 21a and inside the substrate 10. Thereafter, when the position of the laser beam 45 is located on the L end-portion side and outside the substrate 10, the adsorption stage 52 is moved in the Y direction.

After that, while conducting irradiation of the laser beam 45, the controller 61 moves the adsorption stage 52 in the −X direction, so that the laser beam 45 is across the substrate 10 from the L end-portion side to the R end-portion side. In this way, the modified regions 23 are formed along the planned cutting lines 21a and inside the substrate 10. Thereafter, when the position of the laser beam 45 is located on the R end-portion side and outside the rear surface 10b, the adsorption stage 52 is moved again in the Y direction.

As described above, in the first scanning, the controller 61 conducts scanning with the laser beam 45 from the START position to an END position provided on the D end-portion side and the L end-portion side of the substrate 10 and outside the substrate 10 by repeating the movement of the adsorption stage 52 in the X (and −X) direction and the Y direction.

In other words, in the first scanning, on the assumption that the substrate 10 is one region, the laser machining is performed in an arrow t1 direction from the planned cutting line 21a on the U end-portion side that is one end portion of the periphery of the substrate 10 to the planned cutting line 21a on the D end-portion side that is the other end portion of the periphery of the substrate 10, and thereby the modified regions 23 are formed.

Note that, the moving distance in the X direction is set in accordance with the size of the substrate 10. For example, if the moving distance in the X direction is larger than the size (diameter) of the substrate 10, the laser machining for the substrate 10 from the R end-portion side to the L end-portion side is performed.

On the other hand, the moving distance in the Y direction is set in accordance with the chip size. For example, if the chip size in the y direction of the substrate 10 is 240 μm (pv), the number of the planned cutting lines 21a is 400 for the substrate 10 having the diameter of 4 inches. Thus, the scanning is conducted 400 times on the substrate 10 with the laser beam 45 turning left and right.

In addition, output of the laser beam 45 in the first scanning is, for example, 65 mW.

Note that, here, the scanning is conducted with the laser beam 45 turning back at the L end-portion side or the R end-portion side of the substrate 10 in a manner of a single stroke. However, for example, irradiation of the laser beam 45 may not be conducted at turning back to the R end-portion side after scanning is conducted from the R end-portion side to the L end-portion side with irradiation of the laser beam 45, and then the scanning may be conducted from the R end-portion side to the L end-portion side with irradiation of the laser beam 45 again. Instead, the way opposite to the former one may be conducted.

In addition, the scanning is conducted from the planned cutting line 21a provided on the U end-portion side that is an end portion of the substrate 10 to the planned cutting line 21a provided on the D end-portion side that is also an end portion of the substrate 10. However, scanning from the planned cutting line 21a provided on the D end-portion side to the planned cutting line 21a provided on the U end-portion side is acceptable.

The START position and the END position are an example, and thus they may be changed according to the size of the laser machining equipment 50, the substrate 10 and the chip 20.

The second scanning that forms the modified regions in the Y direction is conducted (step 106). Note that, as described later, although the modified regions are formed in the Y direction and the −Y direction in the second scanning, they are collectively referred as formation of the modified regions in the Y direction.

The position of the focal point of the laser beam 45 is $d1=-35$ µm set in the step 104.

In the second scanning, as described in FIG. 5B, the controller 61 firstly moves the adsorption stage 52 to the START position provided on the U end-portion side and the R end-portion side of the substrate 10 and outside the substrate 10.

Then, while conducting irradiation of the laser beam 45, the controller 61 moves the adsorption stage 52 in the Y direction, so that the laser beam 45 is across the substrate 10 from the U end-portion side to the D end-portion side. In this way, the modified regions 23 are formed along the planned cutting lines 21b and inside the substrate 10. Thereafter, when the position of the laser beam 45 is located on the D end-portion side of the substrate 10 and outside the rear surface 10b, the adsorption stage 52 is moved in the −X direction.

After that, while conducting irradiation of the laser beam 45, the controller 61 moves the adsorption stage 52 in the −Y direction, so that the laser beam 45 is across the substrate 10 from the D end-portion side to the U end-portion side. In this way, the modified regions 23 are formed along the planned cutting lines 21b and inside the substrate 10. Thereafter, when the position of the laser beam 45 is located on the U end-portion side of the substrate 10 and outside the rear surface 10b, the adsorption stage 52 is moved again in the X direction.

As described above, in the second scanning, the controller 61 conducts scanning with the laser beam 45 from the START position to the END position provided on the D end-portion side and the L end-portion side of the substrate 10 and outside the substrate 10 by repeating the movement of the adsorption stage 52 in the Y (and −Y) direction and the X direction.

In other words, in the second scanning, on the assumption that the substrate 10 is one region, the laser machining is performed in an arrow t2 direction from the planned cutting line 21b on the R end-portion side that is one end portion of the periphery of the substrate 10 to the planned cutting line 21b on the L end-portion side that is the other end portion of the periphery of the substrate 10, and thereby the modified regions 23 are formed.

Note that, the moving distance in the Y direction is set in accordance with the size of the substrate 10. For example, if the moving distance in the Y direction is larger than the size (diameter) of the substrate 10, the laser machining for the substrate 10 from the U end-portion side to the D end-portion side is performed.

On the other hand, the moving distance in the X direction is set in accordance with the chip size. For example, if the chip size in the x direction of the substrate 10 is 600 µm (ph), the number of the planned cutting lines 21b is 170 for the substrate 10 having the diameter of 4 inches. Thus, the scanning is conducted 170 times on the substrate 10 with the laser beam 45 turning up and down.

In addition, output of the laser beam 45 in the second scanning is, for example, 50 mW. This output is smaller than that of the first scanning (65 mW). The difference between the outputs of the laser beam 45 will be described later.

Here, the scanning is conducted with the laser beam 45 turning back at the U end-portion side or the D end-portion side of the substrate 10 in a manner of a single stroke. However, for example, irradiation of the laser beam 45 may not be conducted at turning back to the U end-portion side after scanning is conducted from the U end-portion side to the D end-portion side with irradiation of the laser beam 45, and then scanning may be conducted from the U end-portion side to the D end-portion side with irradiation of the laser beam 45 again.

In addition, the scanning is conducted in the arrow t2 direction from the planned cutting line 21b provided on the R end-portion side to the planned cutting line 21b provided on the L end-portion side. However, scanning from the planned cutting line 21b provided on the L end-portion side to the planned cutting line 21b provided on the R end-portion side, that is the direction opposite to the arrow t2, is acceptable.

The START position and the END position are an example, and thus they may be changed according to the size of the laser machining equipment 50, the substrate 10 and the chip 20.

As described above, the process for forming the modified regions 23 by irradiating the positions at the deep distance (d1) of the substrate 10 from the rear surface 10b with the laser beam 45 ends.

Inside the substrate 10, the modified regions 23 have been formed along the planned cutting lines 21a and 21b. However, as described above, in the first exemplary embodiment, the substrate 10 is planned to be cut by forming the modified regions in 2 rows, and thus only the modified regions 23 are not enough for the substrate 10 to be cut.

Next, description will be given for a process for forming the modified regions 24 by irradiating positions at the shallow distance (d2) of the substrate 10 from the rear surface 10b with the laser beam 45. Note that, irradiation of the laser beam 45 is conducted along the aforementioned planned cutting lines 21a and 21b used for the irradiation to the deep positions (d1) of the substrate 10 from the rear surface 10. Therefore, the modified regions formed by the irradiation of the laser beam 45 are formed at positions having different distances from the rear surface 10b in 2 rows.

The controller 61 sets the position of the focal point of the laser beam 45 at the distance d2 on the assumption that the rear surface 10b is "zero" (step 107). For example, d2 is −25 µm. Thus, the position of d2 inside the substrate 10 is shallower than the position of d1 (−35 µm) from the rear surface 10b.

Next, the third scanning that forms the modified regions in the X direction is conducted (steps 108 and 109). Note that, the third scanning is divided into 2 steps which are the first step of the third scanning shown in the step 108 and the second step of the third scanning shown in the step 109.

As shown in FIG. 5C, in the third scanning, the substrate 10 is divided into 2 regions AU and AD, and they are irradiated with the laser beam 45. The region AU is a region from the U end portion of the substrate 10 to the central portion (C portion) of the substrate 10, and the region AD is a region from the D end portion of the substrate 10 to the central portion (C portion) of the substrate 10.

The laser machining is performed for the region AU in the first step of the third scanning and for the region AD in the second step of the third scanning.

First, description will be given for the first step of the third scanning (step 108) in which the laser machining is performed for the region AU. Note that, the position of the focal point of the laser beam 45 is d2=−25 μm set in the step 107.

In the first step of the third scanning, as described in FIG. 5C, the controller 61 starts irradiation of the laser beam 45 along the planned cutting line 21a from a START1 position provided on the U end-portion side and the R end-portion side of the substrate 10 and outside the substrate 10, similarly to the step 105 in the first scanning. Then, scanning is conducted with the laser beam 45 in an arrow t31 direction. Subsequently, the irradiation of the laser beam 45 ends at an END1 position provided on the central portion and the R end-portion side of the substrate 10 and outside the substrate 10.

In other words, in the first step of the third scanning as an example of the first machining method, the modified regions 24 are formed from the planned cutting line 21a at the U end portion as one end portion of the periphery of the substrate 10 to the planned cutting line 21a at the central portion (C portion) of the substrate 10 as shown in the arrow t31, in the region AU.

At this time, the number of the planned cutting lines 21a of the first step of the third scanning is half (200) of that of the first scanning (400), and scanning with the laser beam 45 is conducted 200 times on the rear surface 10b while the laser beam 45 turns left and right.

As an example, output of the laser beam 45 in the first step of the third scanning is 75 mW. This output is larger than that of the first scanning (65 mW). The difference between these outputs of the laser beam 45 will be described later.

Next, description will be given for the second step of the third scanning for the region AD (step 109). Note that, the position of the focal point of the laser beam 45 is d2=−25 μm set in the step 107.

In the second step of the third scanning, as shown in FIG. 5C, the controller 61 moves the adsorption stage 52 to a START2 position provided on the D end-portion side and the L end-portion side of the substrate 10 and outside the substrate 10, which is different from the aforementioned first step of the third scanning. The controller 61 moves the adsorption stage 52 along the planned cutting line 21a while irradiation of the laser beam 45 is conducted. Then, scanning with the laser beam 45 is conducted in an arrow t32 direction. Subsequently, the irradiation of the laser beam 45 ends at an END2 position provided on the central portion and the R end portion side of the substrate 10 and outside the substrate 10.

In other words, in the second step of the third scanning as an example of the second machining method, the modified regions 24 are formed from the planned cutting line 21a at the D end portion as the other end portion of the periphery of the substrate 10 to the planned cutting line 21a at the central portion (C portion) of the substrate 10 as shown in the arrow t32, in the region AD.

At this time, the number of the planned cutting lines 21a of the second step of the third scanning is half (200) of that of the first scanning (400), and scanning with the laser beam 45 is conducted 200 times on the rear surface 10b while the laser beam 45 turns left and right.

As an example, output of the laser beam 45 in the second step of the third scanning is 75 mW. This is the same as that of the first step of the third scanning.

As described above, in the first and second steps of the third scanning, the laser machining is performed from one end portion of the periphery of the substrate 10 to the central portion as shown in the respective arrows t31 and t32.

Next, the fourth scanning that forms the modified regions in the Y direction is conducted (step 110). Note that, the position of the focal point of the laser beam 45 is d2=−25 μm set in the step 107.

In the fourth scanning, as shown in FIG. 5D, similarly to the step 106 of the second scanning, on the assumption that the substrate 10 is one region, the laser machining is performed in an arrow t4 direction from the planned cutting line 21b on the R end-portion side that is one end portion of the periphery of the substrate 10 to the planned cutting line 21b on the L end-portion side that is the other end portion of the periphery of the substrate 10, and thereby the modified regions 24 are formed.

At this time, the number of the planned cutting lines 21b in the fourth scanning is 170 which are the same as those in the second scanning. Thus, scanning is conducted 170 times on the rear surface 10b with the laser beam 45 turning up and down in the fourth scanning.

In addition, output of the laser beam 45 in the fourth scanning is, for example, 55 mW. This output is larger than that of the second scanning (50 mW). The difference between these outputs of the laser beam 45 will be described later.

As described above, a process for forming the modified regions 23 and 24 in the first substrate unit 30 by irradiating the positions at the deep distance (d1) and the shallow distance (d2) of the substrate 10 from the rear surface 10b with the laser beam 45 ends.

Then, the controller 61 moves the substrate unit 30 from the adsorption stage 52 to the unloaded cassette 58a with the robot arm (step 111).

Further, the controller 61 determines whether the substrate unit 30 remains in the loaded cassette 57a or not (step 112). If the controller 61 determines that the substrate unit 30 does not remain in the loaded cassette 57a (empty), the laser machining ends. Meanwhile, if the controller 61 determines that the substrate unit 30 remains in the loaded cassette 57a, process returns to the step 101 and the laser machining is conducted for the next substrate unit 30. Similarly, the controller 61 performs the laser machining for all substrate units 30 contained in the loaded cassette 57a.

As described above, in the first exemplary embodiment, irradiation of the laser beam 45 to the different distances from the rear surface 10b is conducted along the planned cutting lines 21a of the substrate 10 in the X direction in the first scanning and the third scanning. Further, irradiation of the laser beam 45 to the different distances from the rear surface 10b is conducted along the planned cutting lines 21b of the substrate 10 in the Y direction in the second scanning and the fourth scanning. Furthermore, the third scanning is divided into two steps as the first step of the third scanning and the second step of the third scanning, and the laser machining is performed from the respective end portions of the substrate 10 to the central portion in the respective regions obtained by dividing the rear surface 10b into 2.

FIG. 6 shows a scanning direction, a distance from the rear surface 10b, an output value of the laser beam 45, a scanning pitch and the number of machined lines in the aforementioned first to fourth scannings.

As described above, although the first and third scannings are the same scanning in the X direction, the distance from the rear surface 10b is different. Further, the output of the laser beam 45 in the third scanning (75 mW) is larger than that in the first scanning (65 mW). The reason is as follows. In the first scanning, since the focal point of the laser beam 45 is set at the deep position from the rear surface 10b, it is near from the LEDs 12 formed on the front surface 10a. Thus, characteristics of the LEDs 12 may be deteriorated by temperature increase, damage or the like caused by irradiation of the laser beam 45. Therefore, the output of the laser beam 45 is set to be small in the first scanning. Meanwhile, the output of the laser beam 45 is set to be large in the third scanning so that the substrate 10 is easily cut into the chips 20 in the breaking process after the laser machining. In other words, the output of the laser beam 45 becomes larger as the distance from the rear surface 10b that the laser beam enters is smaller.

The reason why the output of the laser beam 45 in the fourth scanning (55 mW) is larger than that of the second scanning (50 mW) is the same as the above.

On the other hand, the output of the laser beam 45 in the second scanning (50 mW) is smaller than that in the first scanning (65 mW). The reason is as follows. The planned cutting planes 22a in the X direction in the first scanning are an A plane (11-20) of the single-crystal sapphire and not a cleaved facet, and thus they are difficult to crack. Meanwhile, the planned cutting planes in the Y direction of the second scanning are an M plane (1100) of the single-crystal sapphire and a cleaved facet, and thus they are easy to crack. In other words, the planned cutting lines 21a are in a direction different from a direction along the cleaved facet, and the planned cutting lines 21b are in the direction along the cleaved facet.

Therefore, the output of the laser beam 45 for the irradiation to the planned cutting lines 21b in the direction along the cleaved facet in the second scanning is set to be smaller than the output of the laser beam 45 for the irradiation to the planned cutting lines 21a in the direction different from the direction along the cleaved facet in the first scanning. For this reason, the output of the laser beam 45 in the second scanning is set to be smaller than that in the first scanning.

The reason why the output of the laser beam 45 in the fourth scanning (55 mW) is smaller than that of the third scanning (75 mW) is the same as the above.

FIGS. 7A to 7D are views showing directions in which the substrate 10 is scanned with the laser beam 45 in a case of not using the first exemplary embodiment.

When the case of not using the first exemplary embodiment is compared to the case in the first exemplary embodiment, FIG. 7C that shows the third scanning is different from FIG. 5C in the first exemplary embodiment. In other words, in the third scanning in the case of not using the first exemplary embodiment, on the assumption that the substrate 10 is one region, the laser machining is performed from the planned cutting line 21a on the U end-portion side that is one end portion of the periphery of the substrate 10 to the planned cutting line 21a on the D end-portion side that is the other end portion of the periphery of the substrate 10 in an arrow t3 direction, and thereby the modified regions 24 are formed.

That is, in the case of not using the first exemplary embodiment, the third scanning is not divided into the step 108 and the step 109, and is performed similarly to the first scanning of the step 105 in the flowchart of the first exemplary embodiment shown in FIG. 4.

Note that, in the third scanning in the case of not using the first exemplary embodiment, the output of the laser beam 45 is, for example, 75 mW that is the same as one used in the first step of the third scanning in the first exemplary embodiment.

The other scannings (the first, second and fourth scannings) are the same as those in the first exemplary embodiment.

FIG. 8A is a view for illustrating a cross section of the chip 20 machined by the laser machining method according to the first exemplary embodiment. FIG. 8A is the cross section of the substrate unit 30 taken along a line IB-IB shown in FIG. 1A. In the first exemplary embodiment, the modified regions 23 and 24 are formed inside the planned cutting planes 22a. Thus, in the breaking process, the planned cutting planes 22a that are the planes each obtained by joining the modified regions 23 and 24 and the cracked groove 14 crack, and then the substrate 10 is cut into the chips 20. Thus, the cross section of the chip 20 is formed perpendicularly to the front surface 10a and the rear surface 10b. As described above, the chip 20 has a predetermined shape of the cross section, and thus defect of the shape is inhibited.

On the other hand, FIG. 8B is a view for illustrating a cross section of the chip 20 machined by the laser machining method according to the case of not using the first exemplary embodiment. Similarly to FIG. 8A, it is the cross section taken along a line IB-IB shown in FIG. 1A. In the third scanning, when the laser machining is performed near the D end portion of the substrate 10, the substrate 10 may be partially cut during irradiation of the laser beam 45 as shown in an arrow P1, and a part of the substrate 10 may be displaced on the D end-position side (gap g). Thereby, irradiation of the laser beam 45 is not applied to the inside of the planned cutting plane 22a any more as shown in an arrow P2, and the modified region 24 is formed at a position displaced from the planned cutting line 21a (gap g). Therefore, the plane obtained by joining the modified regions 23 and 24 and the cracked groove 14 does not correspond to the planned cutting plane 22a. Thus, the cross section of the chip 20 has a raised part and a void part caused by the gap g. As described above, the chip 20 does not have the predetermined shape of the cross section, and thus defect of the shape occurs.

The gap tends to occur when the scanning is conducted on the D end-portion side beyond the central portion (C portion) of the substrate 10 on the assumption that the laser machining is performed from the U end-portion side to the D end-portion side of the substrate 10 in the third scanning.

As described above, the output of the laser beam 45 is increased in the third scanning in comparison with that in the first scanning so that the substrate 10 is securely cut into the chips 20 in the following breaking process. Thus, in the third scanning, the substrate 10 irradiated with the laser beam 45 is in a state that it is almost separated into the chips 20. For this reason, it is thought that, in the third scanning, the portion of the substrate 10 to which irradiation of the laser beam 45 has been applied is easy to move at the planned cutting lines 21, and contact with the adsorption stage 52 is increased.

On the other hand, the other portion of the substrate 10 to which irradiation of the laser beam 45 has not been applied is in the state that it is difficult to move at the planned cutting lines 21a. In addition, the substrate 10 has warpage caused by occurrence of stress for preparation of the LEDs 12 and the like. Thus, the substrate 10 originally has weak contact with the adsorption stage 52.

As described above, it is thought that, in the third scanning, when the portion to which irradiation of the laser beam 45 has been applied spreads beyond the center of the substrate 10 and the contact between the portion and the adsorption stage 52 is increased, if the substrate 10 is happened to crack by irradiation of the laser beam 45, the remaining portion to which irradiation of the laser beam 45 has not been applied and which has weak contact with the adsorption stage 52 is displaced (move).

Thus, the planned cutting line 21a in the displaced portion of the substrate 10 is to be displaced from the irradiation position of the laser beam 45.

In contrast, in the first exemplary embodiment, in the third scanning, the rear surface 10b is divided into 2 regions, and the laser machining is set to be performed from the end portion to the central portion of the substrate 10 in each region.

In this case, in the first step of the third scanning, contact to the adsorption stage 52 is increased from the U end-portion side of the substrate 10 to which irradiation of the laser beam 45 has been applied. Meanwhile, in the first step of the third scanning, the remaining portion of the substrate 10 to which irradiation of the laser beam 45 has not been applied is a large area in comparison with the portion of the substrate 10 on the U end-portion side to which irradiation of the laser beam 45 has been applied, and the portion as a whole is adsorbed to the adsorption stage 52. Thus, it is thought that, even if partial cut occurs by irradiation of the laser beam 45, horizontal force does not move any of the portion of the substrate 10 to which irradiation of the laser beam 45 has been applied and the portion of the substrate 10 to which irradiation of the laser beam 45 has not been applied, and displacement (movement) does not occur.

On the other hand, in the second step of the third scanning, contact to the adsorption stage 52 is increased from the D end-portion side of the substrate 10 to which irradiation of the laser beam 45 has been applied. Additionally, contact of the U end-portion side of the substrate 10 to the adsorption stage 52 has already been increased through the first step of the third scanning. Therefore, even if partial cut occurs by irradiation of the laser beam 45, the horizontal force generated thereby does not move not only a portion on the D end-portion side of the substrate 10 to which irradiation of the laser beam 45 has been applied but also the AU region of the substrate 10 to which irradiation of the laser beam 45 has been applied in the first step of the third scanning. For this reason, in the second step of the third scanning, it is thought that the portion to which laser irradiation has not been applied is not displaced.

As described above, in the first exemplary embodiment, displacement of the formed modified regions 23 and 24 from the supposed planned cutting lines 21a and 21b is inhibited.

Note that, it is thought that the reason why gap does not occur in the fourth scanning for forming the modified regions 23 and 24 in the Y direction is that it is not necessary to increase the output of the laser beam 45 until the substrate 10 is almost separated into the chips 20 since the planned cutting lines 21b in the Y direction is in the direction along the cleaved facet and the substrate 10 is easy to crack as described above.

Thus, the laser machining from one end portion of the periphery of the substrate 10 to the central portion, which is performed by dividing the rear surface 10b into plural regions like the first and second steps of the third scanning in the first exemplary embodiment, may be applicable to a case in which the planned cutting lines are supposed to be set in a direction different from the direction along the cleaved facet, like the planned cutting lines 21a.

Therefore, the laser machining from one end portion of the periphery of the substrate 10 to the central portion, which is performed by dividing the rear surface 10b into plural regions, may be performed at the last one of the plural irradiation of the laser beam 45 to the planned cutting lines 21a and 21b conducted by changing distance from the entrance surface on the substrate 10.

Note that, in the first exemplary embodiment, the third scanning in which the rear surface 10b is divided into 2 regions is conducted at the last irradiation to the planned cutting lines 21a in the X direction.

Second Exemplary Embodiment

FIGS. 9A to 9D are views showing directions of the laser beam 45 with which the scanning is conducted on the substrate 10 in a laser machining method in the second exemplary embodiment.

In the second exemplary embodiment, the substrate unit 30 shown in FIGS. 1A to 1C, the laser machining equipment 50 shown in FIG. 2, and the method for forming the modified regions 23 and 24 inside the substrate 10 by the laser machining shown in FIGS. 3A1 to 3B2 are the same as those in the first exemplary embodiment.

Difference between the second exemplary embodiment and the first exemplary embodiment is 3 divided regions of the substrate 10 in the third scanning shown in FIG. 9C. That is, the substrate 10 includes a region BU from the U end portion toward the central portion, a region BD from the D end portion toward the central portion and a region BC at the central portion. Further, the third scanning is divided into a first step of the third scanning for the region BU, the second step of the third scanning for the region BD, and the third step of the third scanning for the region BC, and they are conducted in this order.

In the first step of the third scanning, similarly to the first step of the third scanning in the first exemplary embodiment, the laser machining is performed from the U end portion toward the central portion for the region BU. In the second step of the third scanning, similarly to the second step of the third scanning in the first exemplary embodiment, the laser machining is performed from the D end portion toward the central portion for the region BD. Note that, since the detail of the laser machining is the same as that in the first exemplary embodiment, the detailed description will be omitted here.

Finally, in the third step of the third scanning, the laser machining is performed for the region BC. If it is conducted after the first and second steps of the third scanning, the regions BU and BD are adsorbed to the adsorption stage 52 so as not to be displaced (moved), as described above. Thus, the region BC at the central portion (C portion) is sandwiched therebetween and is not moved. For this reason, the third step of the third scanning is started from any one of sides of the region BC near the region BU and the region BD.

In other words, in the second exemplary embodiment, the laser machining is performed from the end portion toward the central portion for the end-portion regions of the substrate 10, and then the laser machining is performed for the central region.

The other scannings (first, second and fourth scannings) are the same as those in the first exemplary embodiment.

By this operation, similarly to the first exemplary embodiment, displacement of the formed modified regions 23 and 24 from the supposed planned cutting lines 21a and 21b is inhibited.

Note that, although the substrate 10 is divided into 3 regions in the second exemplary embodiment, it may be divided into plural regions more than 3.

In the first and second exemplary embodiments, a pulsed excimer laser beam with a wavelength of 266 nm may be used. Instead, $CO_2$ laser, YAG laser, or YLF (Yttrium Lithium Fluoride) laser may be used.

Further, although the modified regions 23 and 24 are formed twice by changing distance from the rear surface 10b in the first and second exemplary embodiments, modified regions may be formed 3 times for the respective planned cutting lines 21a and 21b by setting 3 positions from the rear surface 10b. In this case, in the scanning for the third time, the rear surface 10b is divided into plural regions, and the laser machining is performed from the end portion toward the central portion of the substrate 10 for the end-portion regions of the substrate 10. Alternatively, more than 3 times is acceptable. Additionally, the position from the rear surface 10b is settable in consideration of the thickness of the substrate 10.

The order of scanning in the X direction and the Y direction in these exemplary embodiments is the X direction, and then the Y direction. However, it is changeable to the Y direction, and then the X direction. Further, scanning with laser beam 45 is conducted in the X direction and the Y direction alternately in these exemplary embodiments. However, it may be conducted repeatedly in one direction.

In these exemplary embodiments, the output of the laser beam 45 is changed in accordance with the distance from the rear surface 10. However, it may be set at the same value, or the output of the laser beam 45 in the case of the large distance from the rear surface 10b may be set to be larger than that in the case of the small distance therefrom.

Although the substrate 10 having the cracked grooves 14 is used in these exemplary embodiments, the substrate 10 not having the cracked grooves 14 may be accepted.

Although the substrate 10 is made of single-crystal sapphire in these exemplary embodiments, it may be made of Si, SiC or GaAs semiconductor, glass, ceramics or the like.

Further, the laser machining method of the present invention is not limited to the manufacturing method of the light-emitting element (LED) made of group-III nitride semiconductor, and that of the light-emitting element (LED) made of a material other than group-III nitride semiconductor, an integrated circuit like an LSI, micro electro mechanical systems (MEMS) in which an organization system is incorporated with electric or electronic circuits may be accepted.

BRIEF DESCRIPTION OF THE DRAWINGS

FIGS. 1A to 1C are views for illustrating a substrate used in the first exemplary embodiment;

FIGS. 3A1 to 3B2 are views for illustrating a method for forming the modified regions inside the substrate by the laser machining;

FIG. 6 is a table showing a scanning direction, a distance from the rear surface, an output value of the laser beam, a scanning pitch and the number of machined lines;

FIGS. 7A to 7D are views showing directions in which the substrate is scanned with the laser beam in a case of not using the first exemplary embodiment;

DESCRIPTION OF REFERENCE NUMERALS AND SIGNS

Figure 2:
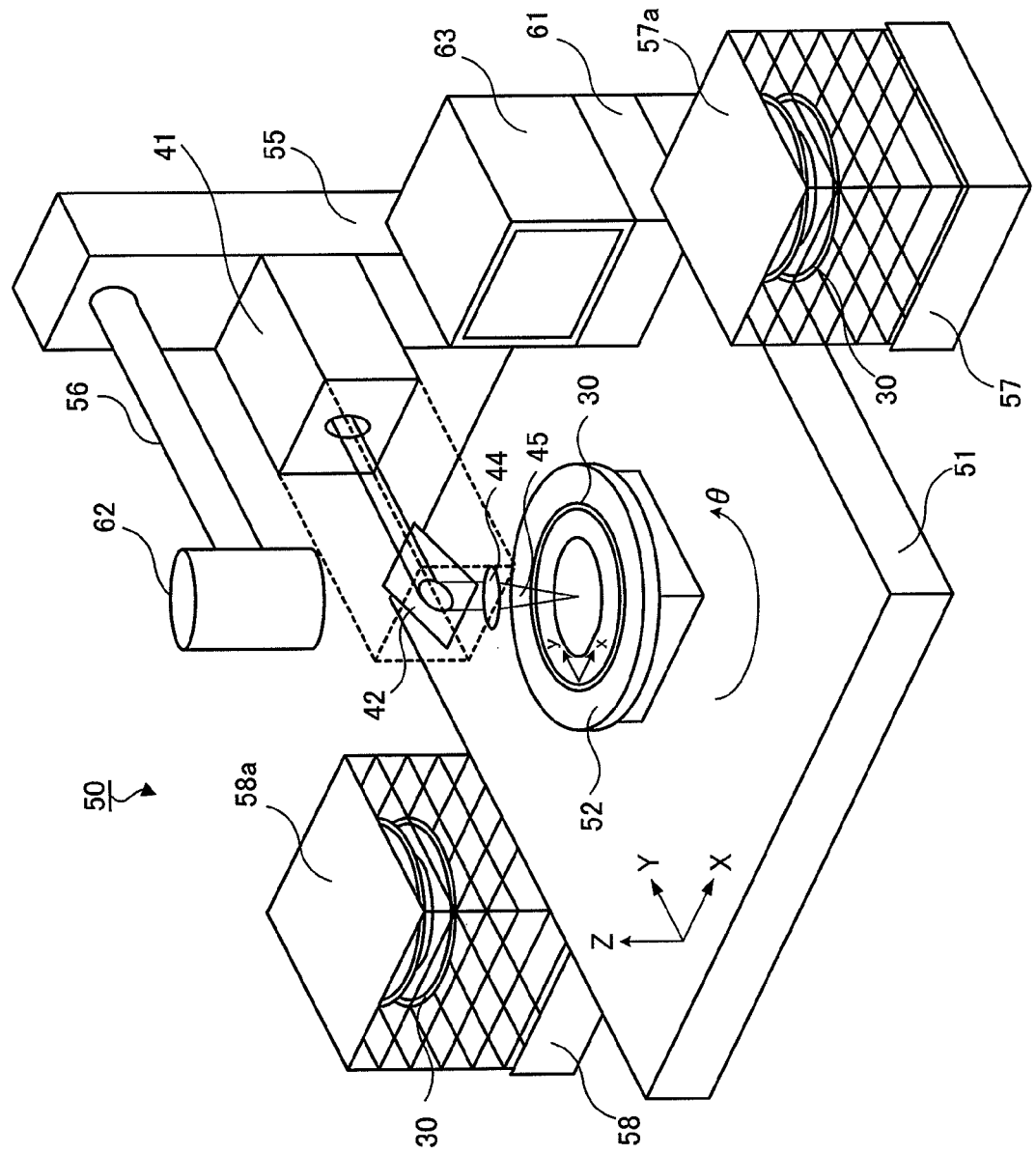
FIG. 2 is a view for illustrating a laser machining equipment used in the first exemplary embodiment.
Figure 4:
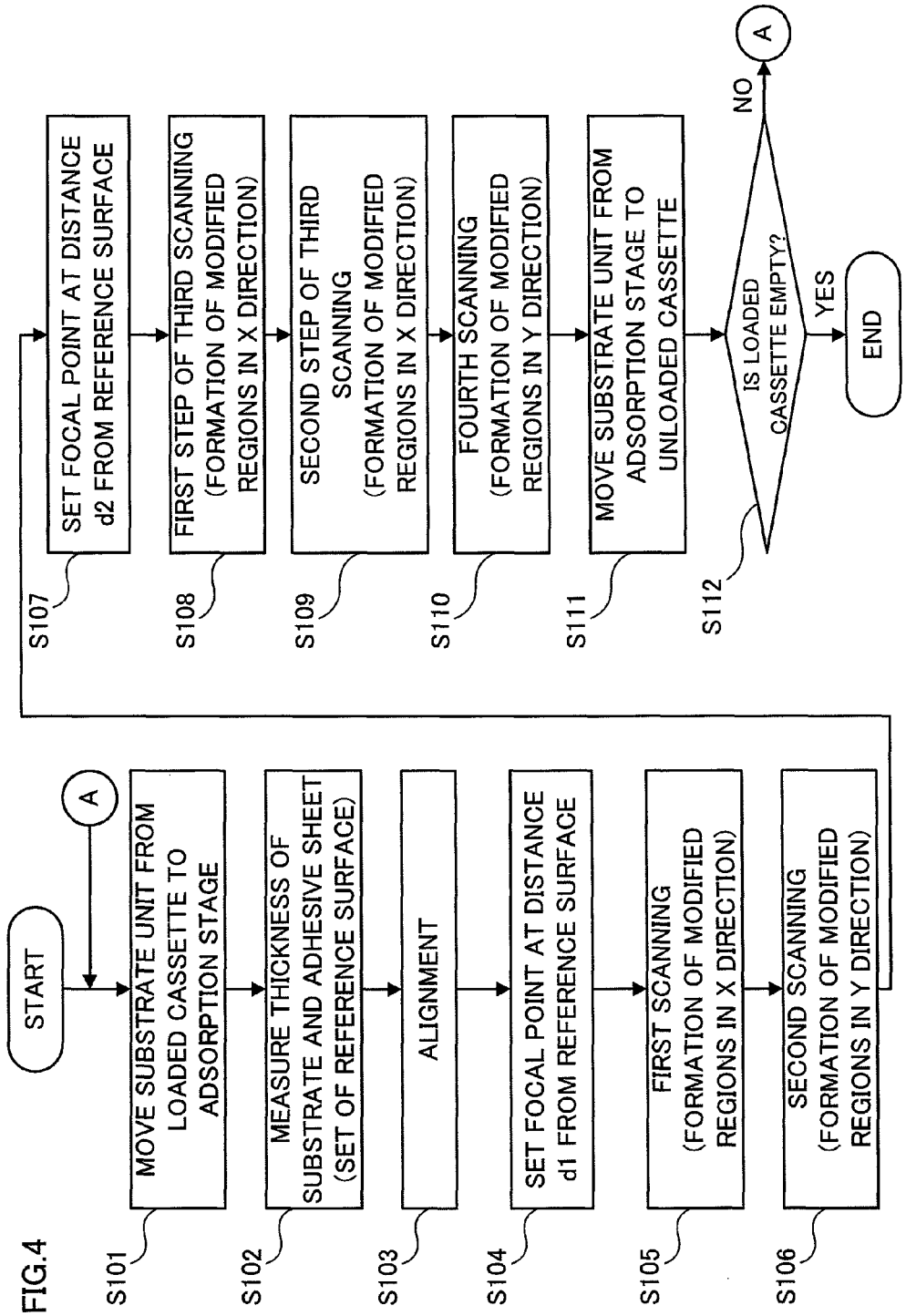
FIG. 4 is a flowchart of the laser machining method in the first exemplary embodiment.
Figure 5:
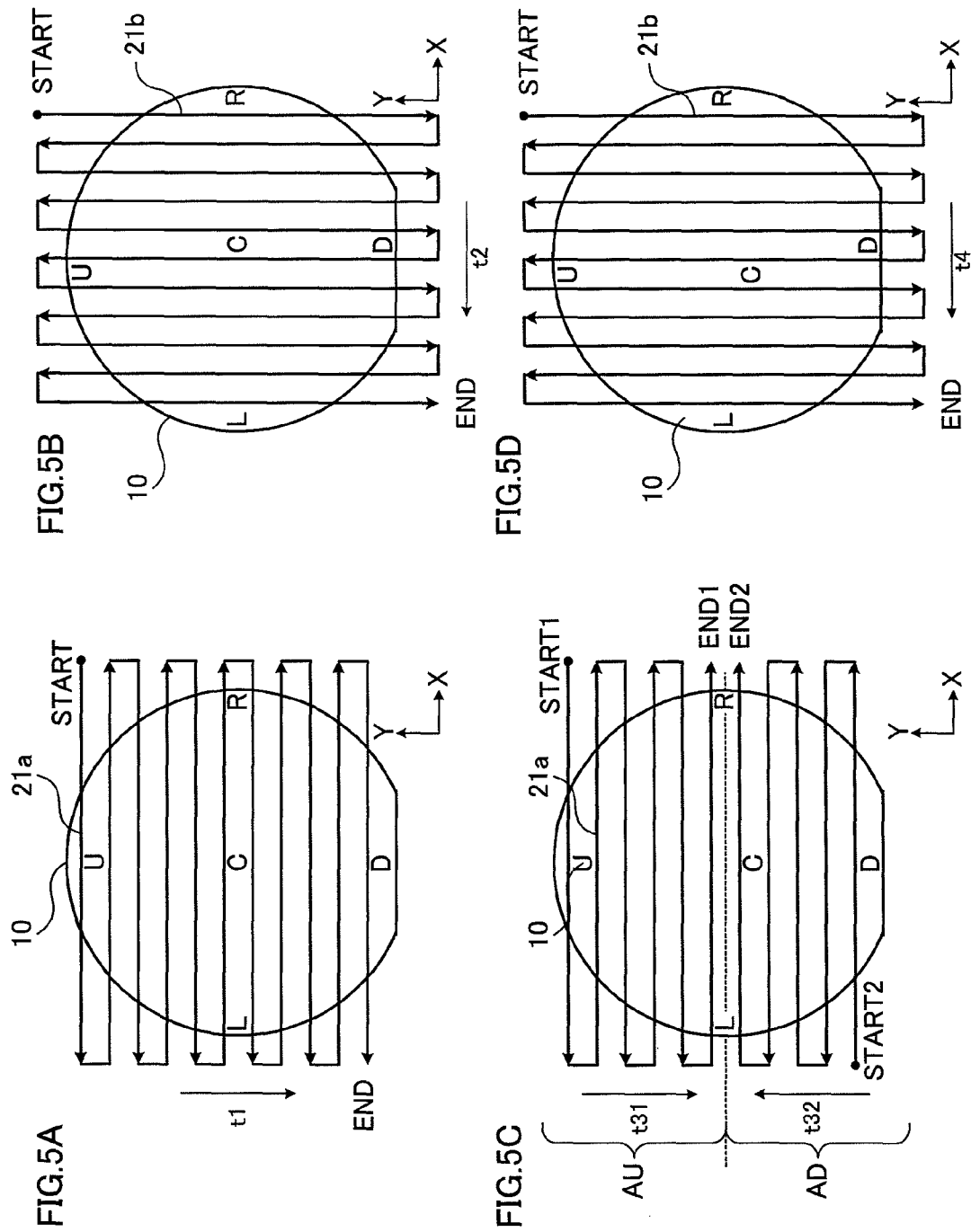
FIGS. 5A to 5D are views showing directions in which the substrate is scanned with the laser beam in the laser machining method in the first exemplary embodiment.
Figure 8A:
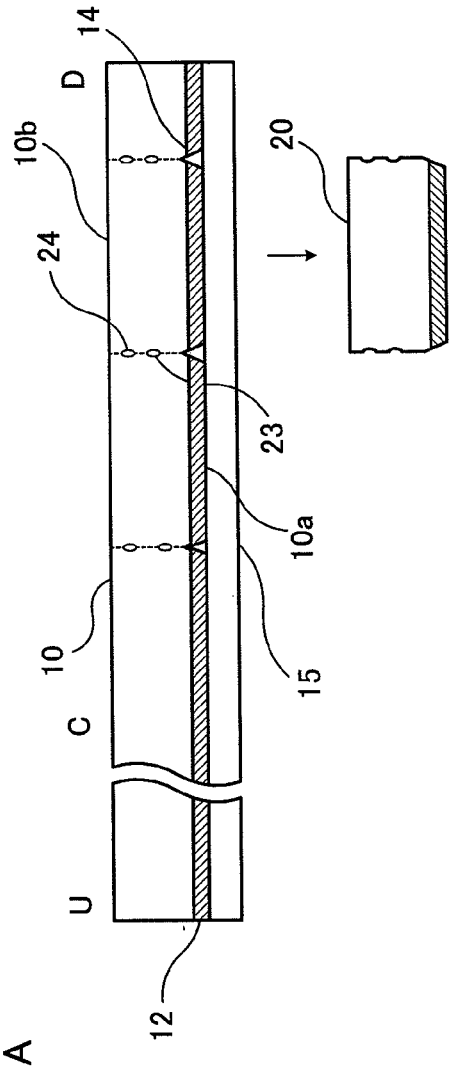
FIGS. 8A and 8B are views for illustrating a cross section of the chip in the first exemplary embodiment and a cross section of the chip in the case of not using the first exemplary embodiment.
Figure 8B:
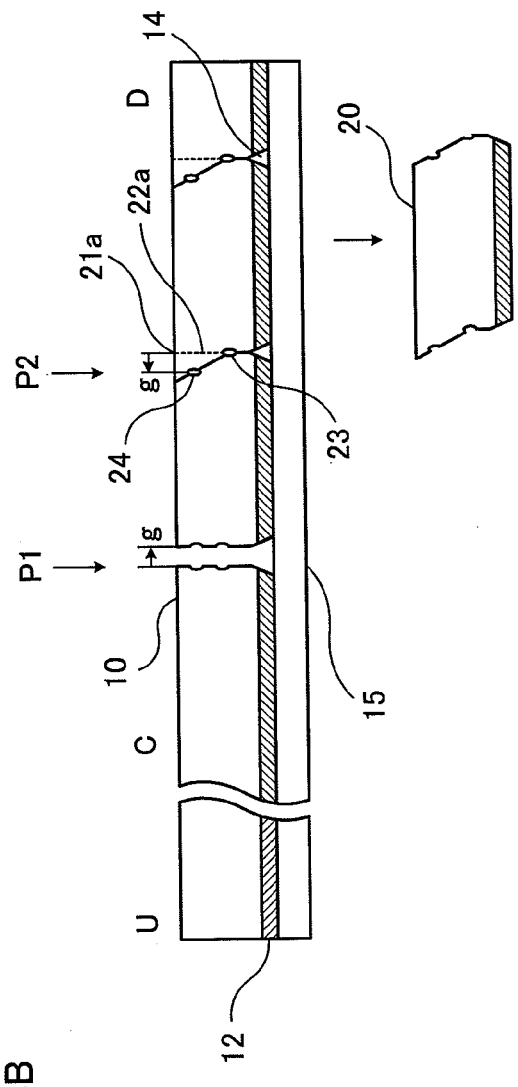
Figure 9A:
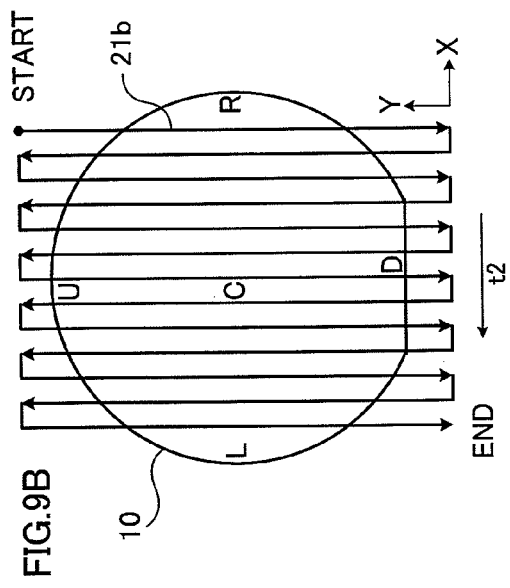
FIGS. 9A to 9D are views showing directions of the laser beam with which the scanning is conducted on the substrate 10 in a laser machining method in the second exemplary embodiment.
Figure 9B:
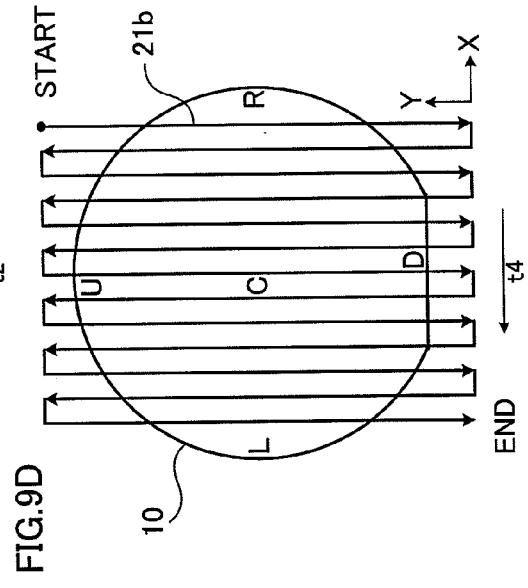
Figure 9C:
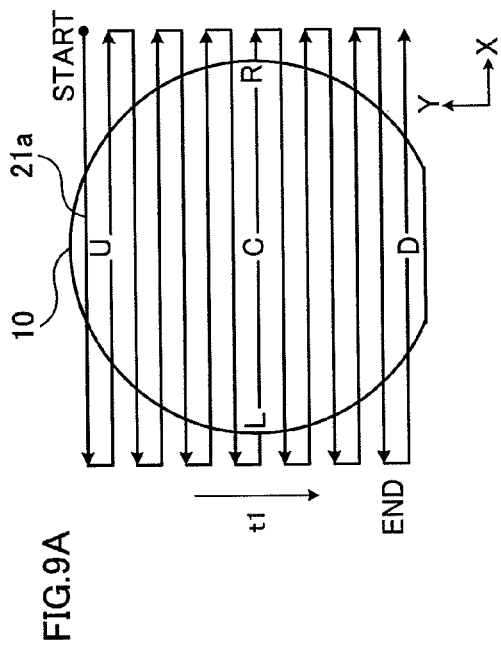
Figure 9D:
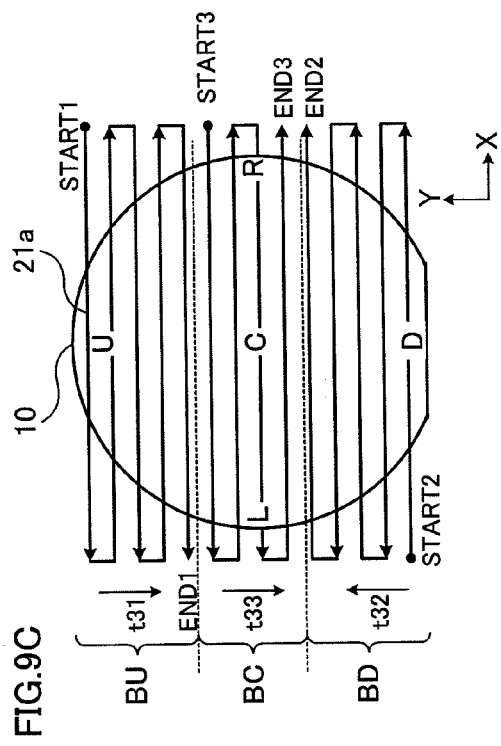

10 . . . substrate
11 . . . orientation flat (OF)
12 . . . LED
13a, 13b . . . electrode
15 . . . adhesive sheet
16 . . . metallic ring
20 . . . chip
21a, 21b . . . planned cutting line
22a . . . planned cutting plane
30 . . . substrate unit
41 . . . laser beam generator
42 . . . dichroic mirror
44 . . . optical system
45 . . . laser beam
50 . . . laser machining equipment
51 . . . base
52 . . . adsorption stage
55 . . . support
56 . . . arm
57 . . . loaded cassette elevator
57a . . . loaded cassette
58 . . . unloaded cassette elevator
58a . . . unloaded cassette
61 . . . controller
62 . . . image capture portion
63 . . . display portion

The invention claimed is:

1. A laser machining method in which irradiation of a focused laser beam is applied to a plurality of distances from one surface of a substrate formed into a plate on the basis of a planned cutting line supposed to be set on the substrate so that modified regions at the plurality of distances are formed inside the substrate a plurality of times, comprising:

a first forming process in which, in the case where the modified regions are formed at a distance except the nearest distance with the one surface of the substrate, the modified regions are formed from one end portion of a periphery of the substrate toward an opposite end portion of the periphery of the substrate along the planned cutting line; and a second forming process that includes, in the case where the modified regions are formed at the nearest distance with the one surface of the substrate, a first machining method for forming the modified regions from the one end portion of the periphery of the substrate starting at a first end point towards a central portion of the substrate along the planned cutting line, and a second machining method for forming the modified regions from the opposite end portion of the periphery of the substrate starting at a second end point opposite the first end point toward the central portion of the substrate along the planned cutting line at least once in the plurality of times, wherein the second machining method is conducted after the first machining method.

2. The laser machining method according to claim 1, wherein
when the planned cutting line is supposed to be set in a direction different from a direction along a cleaved facet of the substrate, the modified regions are formed by the first machining method and the second machining method.

3. The laser machining method according to claim 1, wherein
the first forming process and the second forming process are formed at a first formation time and second formation time, respectively, a formation time being measured from a beginning time to a time in which the respective modified regions for the planned cutting lines are formed on the substrate, the first formation time and the second formation time being greater than the formation time for any other machining method, respectively.

4. The laser machining method according to claim 1, wherein
at the plurality of distances from the one surface of the substrate, the formation of the modified regions inside the substrate the plurality of times for each of the distances is performed from a large distance from an entrance surface of the laser beam on the substrate to a small distance therefrom.

5. The laser machining method according to claim 1, wherein
the substrate is a C-axis orientation sapphire, and the planned cutting line is supposed to be set in a direction different from a direction along a crystal plane (1100).

6. A manufacturing method of a compound semiconductor light-emitting element comprising:
preparing an n-type semiconductor layer, a light-emitting layer and a p-type semiconductor layer on a substrate in this order by epitaxial growth;
forming a plurality of compound semiconductor light-emitting elements on the substrate prepared by the epitaxial growth; and
conducting the laser machining method according to claim 1 after forming the plurality of compound semiconductor light-emitting elements.

7. The manufacturing method of a compound semiconductor light-emitting element according to claim 6, wherein
when the planned cutting line is supposed to be set in a direction different from a direction along a cleaved facet of the substrate, the modified regions are formed by the first machining method and the second machining method.

8. The manufacturing method of a compound semiconductor light-emitting element according to claim 6, wherein
the first forming process and the second forming process are formed at a first formation time and second formation time, respectively, a formation time being measured from a beginning time to a time in which the respective modified regions for the planned cutting lines are formed on the substrate, the first formation time and the second formation time being greater than the formation time for any other machining method, respectively.

9. The manufacturing method of a compound semiconductor light-emitting element according to claim 6, wherein
at the plurality of distances from the one surface of the substrate, the formation of the modified regions inside the substrate the plurality of times for each of the distances is performed from a large distance from an entrance surface of the laser beam on the substrate to a small distance therefrom.

10. The manufacturing method of a compound semiconductor light-emitting element according to claim 6, wherein
when the modified regions at the plurality of distances from the one surface of the substrate are formed inside the substrate the plurality of times, output of the laser beam becomes larger as a distance from an entrance surface of the laser beam on the substrate is smaller.

11. The manufacturing method of a compound semiconductor light-emitting element according to claim 6, wherein
the substrate is a C-axis orientation sapphire, and the planned cutting line is supposed to be set in a direction different from a direction along a crystal plane (1100).

12. A laser machining method for forming a modified region inside a substrate formed into a plate, comprising:
a modified region formation process in which irradiation of a focused laser beam is applied to a plurality of distances from one surface of the substrate in a thickness direction thereof on the basis of a planned cutting line supposed to be set on the substrate so that modified regions at the plurality of distances are formed inside the substrate a plurality of times, wherein
the modified region formation process includes:
a first forming process in which, in the case where the modified regions are formed at a distance except the nearest distance with the one surface of the substrate, the modified regions are formed from one end portion of a periphery of the substrate toward an opposite end portion of the periphery of the substrate along the planned cutting line, and
a second forming process that includes, in the case where the modified regions are formed at the nearest distance with the one surface of the substrate:
an X-direction modified region formation process for forming the modified regions in an X-direction of the substrate; and
a Y-direction modified region formation process for forming the modified regions in a Y-direction of the substrate, the Y-direction being perpendicular to the X-direction,
at least one of the X-direction modified region formation process and the Y-direction modified region formation process includes:
a first laser machining process for forming the modified regions in a first region of the substrate, the first region extending from the one end portion of the periphery of the substrate to a central portion of the substrate, the first laser machining process forming the modified regions from the one end portion towards the central portion of the substrate; and
a second laser machining process for forming the modified regions in a second region of the substrate, the second region extending from the other end portion of the periphery of the substrate to the central portion of the substrate, the second laser machining process forming the modified regions from an end portion of the periphery of the substrate in the second region opposite to the one end portion in the first region towards the central portion of the substrate, and
output of the laser beam becomes larger as a distance from an entrance surface of the laser beam on the substrate is smaller,
the second laser machining process is conducted after the first laser machining process.

13. The laser machining method according to claim 12, wherein, in the modified region formation process, the first laser machining process and the second laser machining process are performed on the basis of the planned cutting line supposed to be set in a direction different from a direction along a cleaved facet of the substrate.

14. The laser machining method according to claim 12, wherein the first laser machining process starts irradiation of the laser beam at a first start point, scans the substrate with the laser beam toward the central portion of the substrate and ends the irradiation of the laser beam at a first end point, thereby to form the modified regions, the first start point being located at a side of the one end portion of the periphery of the substrate in the first region and outside of the substrate, the first end point being located at a side of an end portion of the central portion of the substrate and outside of the substrate, and the second laser machining process starts irradiation of the laser beam at a second start point, scans the substrate with the laser beam toward the central portion of the substrate and ends the irradiation of the laser beam at a second end point, thereby to form the modified regions, the second start point being located at a side of the other end portion of the periphery of the substrate in the second region and outside of the substrate, the second end point being located at a side of an end portion of the central portion of the substrate and outside of the substrate.

15. A manufacturing method of a compound semiconductor light-emitting element comprising:

preparing an n-type semiconductor layer, a light-emitting layer and a p-type semiconductor layer on a substrate in this order by epitaxial growth;

forming a plurality of compound semiconductor light-emitting elements on the substrate prepared by the epitaxial growth; and conducting the laser machining method according to claim 12 after forming the plurality of compound semiconductor light-emitting elements.

16. The laser machining method according to claim 12, wherein a modified region in the Y-direction that is closest to the entrance surface, from among the modified regions in the Y-direction, being formed with an output of the laser beam larger than any other modified region in the Y-direction.

* * * * *